United States Patent
Hotzel et al.

(10) Patent No.: US 9,798,244 B2
(45) Date of Patent: Oct. 24, 2017

(54) METHODS, APPARATUS, AND SYSTEMS FOR MINIMIZING DEFECTIVITY IN TOP-COAT-FREE LITHOGRAPHY AND IMPROVING RETICLE CD UNIFORMITY

(71) Applicant: GLOBALFOUNDRIES Inc., Grand Cayman (KY)

(72) Inventors: Arthur Hotzel, Dresden (DE); Philipp Jaschinsky, Dresden (DE); Remi Riviere, Dresden (DE); Wolfram Grundke, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 181 days.

(21) Appl. No.: 14/943,086

(22) Filed: Nov. 17, 2015

(65) Prior Publication Data
US 2017/0139330 A1    May 18, 2017

(51) Int. Cl.
*G03F 1/50* (2012.01)
*G03F 1/70* (2012.01)
*G03F 7/20* (2006.01)

(52) U.S. Cl.
CPC ............ *G03F 7/70325* (2013.01); *G03F 1/50* (2013.01); *G03F 1/70* (2013.01)

(58) Field of Classification Search
None
See application file for complete search history.

(56) References Cited

U.S. PATENT DOCUMENTS

| 2004/0044982 A1* | 3/2004 | Baggenstoss | G03F 1/36 430/5 |
| 2015/0140478 A1* | 5/2015 | Chen | G03F 1/36 430/5 |

* cited by examiner

*Primary Examiner* — Stephen Rosasco
(74) *Attorney, Agent, or Firm* — Ditthavong & Steiner, P.C.

(57) ABSTRACT

Methods, apparatus, and system for minimizing defectivity in top-coat-free immersion photolithography are provided. Embodiments include forming a photomask by defining a first pattern including a main functional pattern in the photomask; and defining a second pattern including a sub-resolution fill pattern in the photomask in areas between or and/or within structures of the first pattern, the fill pattern having a pitch or range of pitches smaller than a minimum resolved pitch of the lithographic exposure and/or at least a part of the sub-resolution structures of the sub-resolution fill pattern not substantially modifying an imaging of any structure of the main functional pattern in the lithographic exposure.

20 Claims, 8 Drawing Sheets

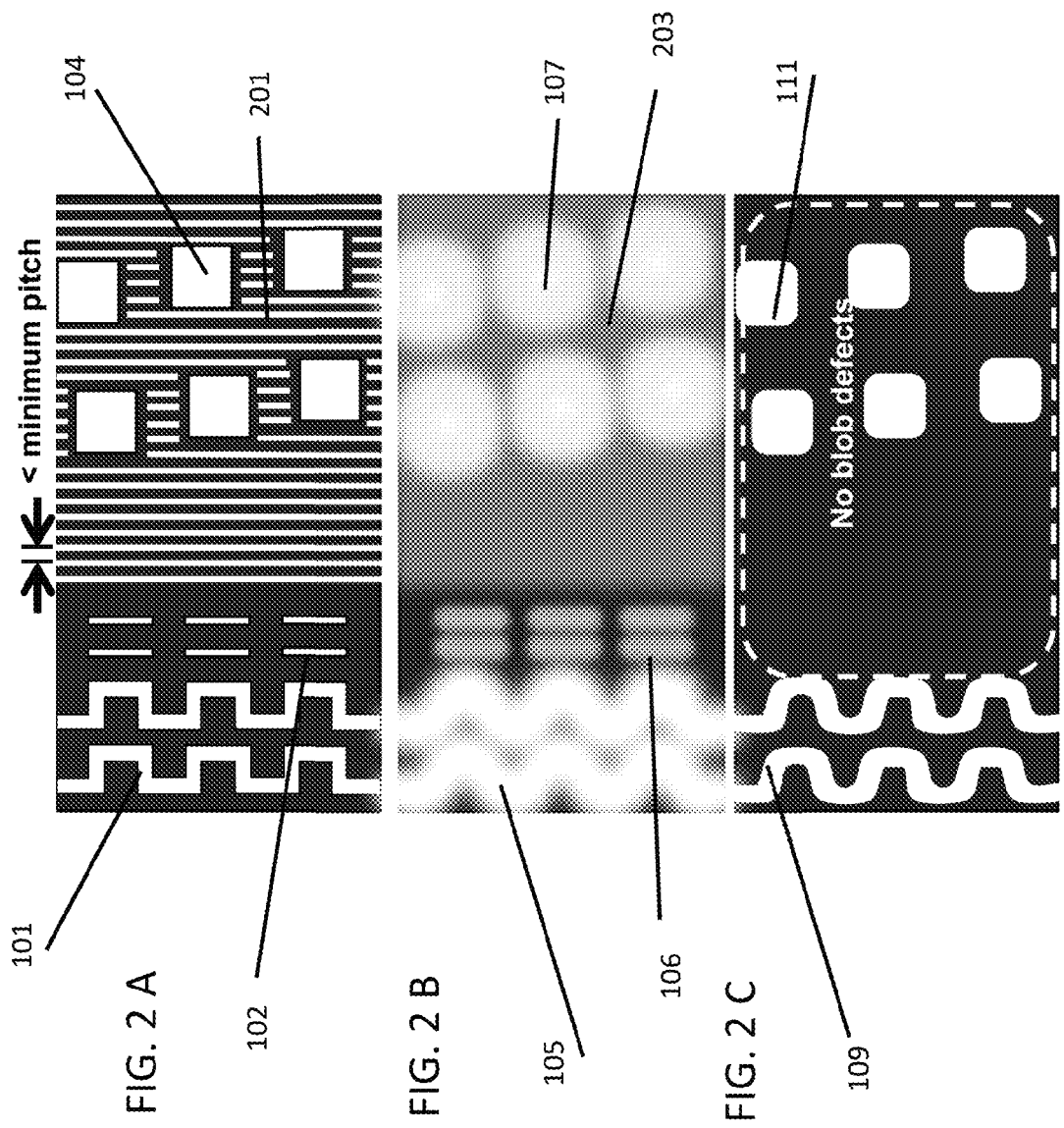

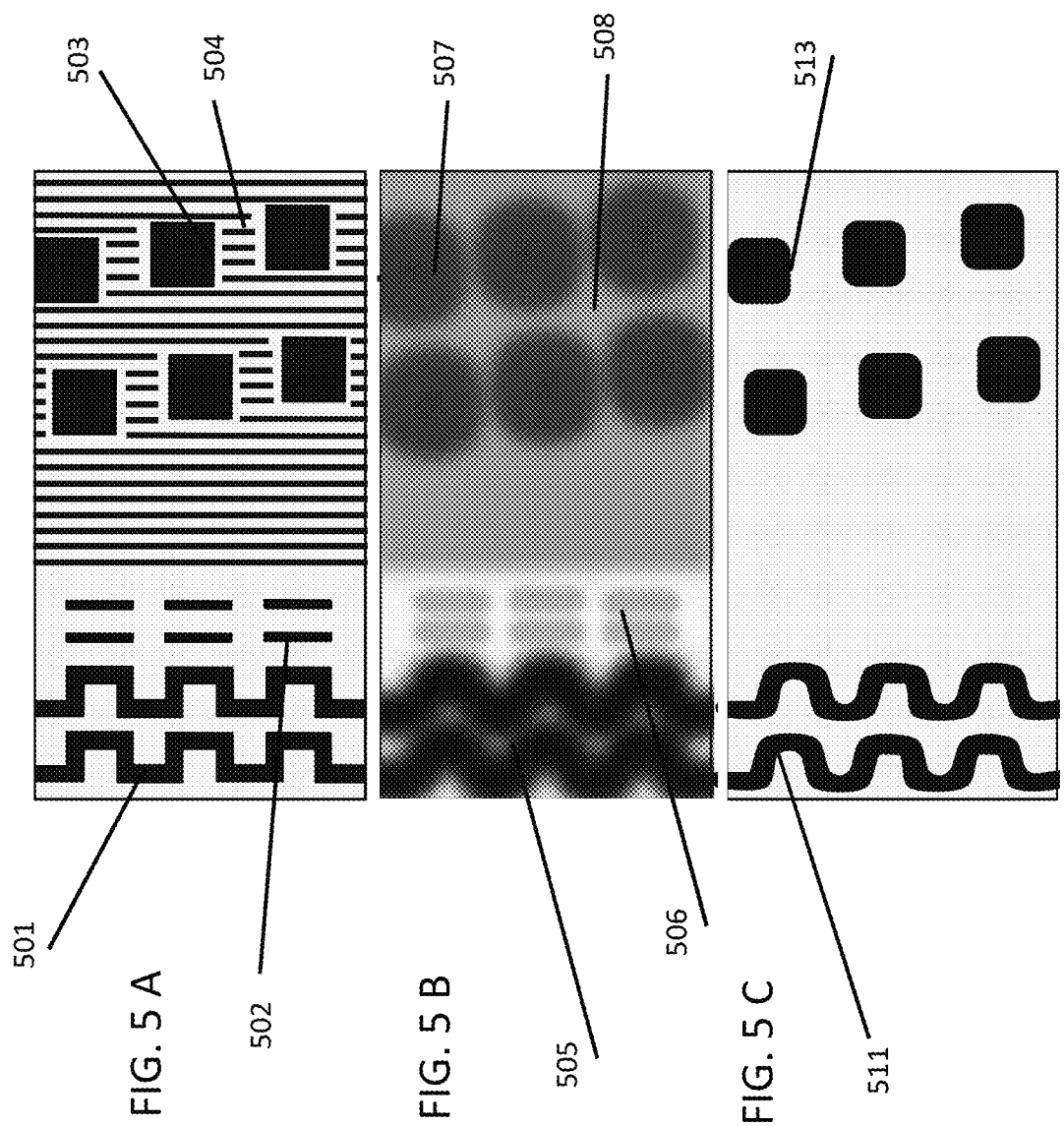

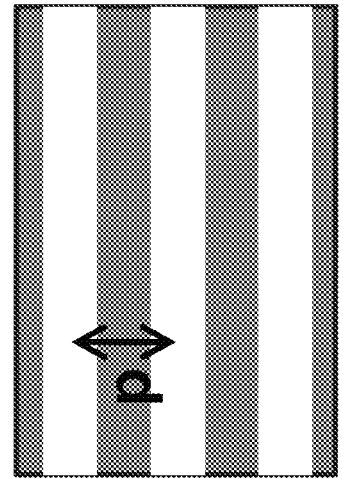
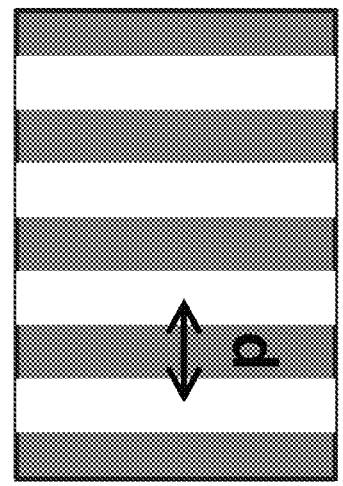
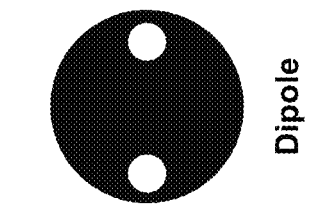
FIG. 7A  FIG. 7B  FIG. 7C
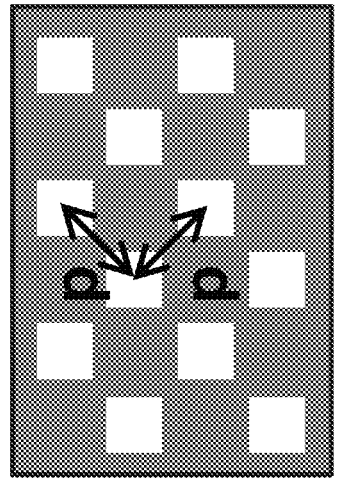
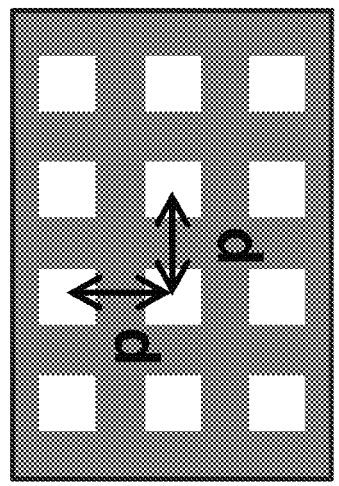
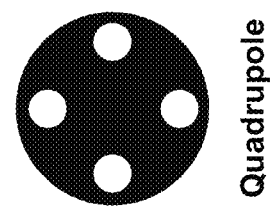
FIG. 7D  FIG. 7E  FIG. 7F

METHODS, APPARATUS, AND SYSTEMS FOR MINIMIZING DEFECTIVITY IN TOP-COAT-FREE LITHOGRAPHY AND IMPROVING RETICLE CD UNIFORMITY

TECHNICAL FIELD

This disclosure relates to lithography methods, apparatus, and systems. In particular, this disclosure relates to methods, apparatus, and systems for top-coat-free immersion lithography.

BACKGROUND

Immersion lithography is useful for enhanced resolution photolithographic printing for the manufacture of, for example, integrated circuits. Photolithography or lithography is a microfabrication process in which light is used in an exposure step to transfer by way of projection geometric patterns from a photomask, also known as a reticle or simply a mask, to light-sensitive material called a photoresist disposed on a substrate such as a wafer. Areas where the photoresist is removed in a development step following the exposure may be filled or further patterned through successive processing. Immersion lithography techniques include using an immersion liquid interposed, with the photoresist, between the substrate and a lens of an exposure system from which light is emitted for patterning the photoresist and the substrate.

Earlier immersion lithography processes used a top coat to protect the photoresist from degradation and from contaminating the immersion liquid at the interface between the immersion liquid and the photoresist. Top coats were substantially obviated by the introduction of special "immersion resists" suitable for use with immersion liquids. It is desirable to avoid using a top coat to minimize material costs, to achieve process simplification, and to minimize potential sources of defects.

An unexposed immersion photoresist has a hydrophobic surface, however, which may cause problems in aqueous development processes. In particular, in and near large unexposed areas, organic material can coagulate during the (aqueous) development process of a positive lithographic process (wherein the illuminated parts of the resist are removed in the development step), leading to characteristic defects, which are sometimes called "blob" defects, or organic residues. A top coat may be used to address such defects because the top coat may contain acidic components that slightly deprotect the underlying resist, leading to a certain top loss and a less hydrophobic remaining resist surface. Therefore, depending on the layout of the photolayer, or the desired resulting pattern of the lithographic processing, a top coat may be needed not to enable immersion exposure, but to ensure a low defect level after development. A similar problem can arise in conventional non-immersion lithography, in which a top anti-reflective coating (TARC) may be required to prevent defects in certain layout situations.

Another problem with large unexposed areas of a photoresist lies in the photomasks or reticles. Advanced reticles are patterned by electron lithography, wherein the mask pattern is written into a thin resist layer with an electron beam or e-beam writer, followed by a development and an etch process. Because these processes have a dependency on pattern density, a variation in pattern density within the mask layout can lead to structure size (critical dimension or CD) variations on the reticle. In particular, the back scattering of electrons in a glass substrate of the reticle causes a strong pattern density dependence with an equal or less than 10 micron (10μ) length scale, which corresponds to about a 1 to 2μ length scale on a wafer (because the photomask is typically projected onto the wafer with an inverse magnification factor, typically 4). To compensate for this effect, algorithms are used in the mask writing process to modify shot size and/or beam dose. Such compensation mechanisms can lack accuracy and precision. To avoid reticle-induced CD uniformity problems, it is therefore beneficial to create a homogeneous pattern density in the mask layout down to the <1μ length scale (wafer level).

In the following, all length or area values will refer to the wafer scale, unless stated otherwise. Also, it will be assumed for convenience that the substrate patterned in the lithographic process is a wafer (which is by far the most common application of lithography), unless the description refers to the patterning of a reticle. Still, the methods, devices and systems disclosed here are not restricted to the processing of wafer substrates. Finally, the wafer lithography processes illustrated in the examples will be understood as being positive lithography processes using aqueous developer, unless stated otherwise.

The above-mentioned back scattering effect in e-beam writing and the corresponding compensation mechanisms have the effect of reducing the lithographic contrast of the mask writing process in and near regions of high writing density. Such layout situations can exist, for example, in the writing of a clear field reticle for an active layer in a positive mask lithography process. In such a reticle, the CD uniformity of the reticle is degraded near large clear areas. It is therefore beneficial to reduce the clear field percentage on the reticle in such layout situations.

In summary, in the mask layout, it is beneficial to avoid large "dark" areas in a positive lithographic process with an aqueous development process, because such areas can cause characteristic defects such as blob defects or organic residues on the wafer, particularly in a top coat free process; avoid large areas with high writing density on the reticle which cause a decrease of contrast in the reticle patterning process, for example, large clear areas if the mask lithography process is a positive process; and keep the pattern density as homogeneous as possible down to the <1μ length scale to avoid CD variation by pattern density dependent effects.

Layout areas that do not contain functional structures are often filled with fill pattern, which typically contains relatively large, simple, regular structures such as squares. Because such fill pattern appears on the wafer after patterning, it can only be used in areas where it does not interfere with the functional pattern in the previous or subsequent layers. Also, to avoid optical cross talk with a functional pattern caused by diffraction effects, a certain minimum distance has to be kept between a functional pattern and fill pattern of typically >1μ.

FIGS. 1A through 1C show a typical mask layout, a resist coated wafer during an exposure step with the mask, and a resulting print after a development step, respectively. Light portions in FIG. 1A represent portions on the reticle where the absorber layer has been removed (clear portions), light portions in FIG. 1B represent illuminated portions of the wafer during exposure, and light portions in FIG. 1C represent portions of the wafer where the resist has been removed during development. FIG. 1A shows a functional pattern including a main functional pattern 101 and sub-resolution assist features (SRAFs, also called scatter bars or scattering bars) 102, and a "conventional" fill pattern 104.

For convenience, the reticle pattern is shown on the same scale as the wafer pattern, although in reality it is typically magnified by a factor of typically 4; and the corner rounding of the reticle pattern, which is typically less pronounced than the corner rounding of the corresponding wafer pattern, is not shown. The function of the SRAFs, which are not printed on a wafer in a lithographic process because they are too small, is to support the main functional pattern by enhancing the depth of focus and optical contrast of the latter in the lithographic exposure step. Placing SRAFs to support main functional pattern and/or placing conventional, printing fill pattern is not always necessary, and not essential to the methods, devices, and systems disclosed here, but common in advanced lithography. Other than the SRAFs, the fill pattern 104 also appears in the printed wafer pattern, it should therefore be disposed at a minimum distance from the functional pattern, which is typically >1μ.

In the following, structures of the reticle pattern intended to appear on the patterned wafer to fulfill a, usually electric, function will be referred to as main functional pattern. The term "functional pattern" will be used to denote pattern including a main functional pattern and/or optical support structures of the main functional pattern such as SRAFs.

A dark area having a width of typically >1μ interposes the functional pattern 101, 102 and the fill pattern 104. The dark area and a part of the area around the relatively large structures of the fill pattern 104 are not illuminated during the lithographic exposure. For example, FIG. 1B shows the images 105, 106 and 107 of the functional pattern 101, 102 and the fill pattern 104, respectively, illuminated during lithographic exposure. In a top coat free immersion lithographic process, the dark areas including areas around structures of the fill pattern 107 have a higher risk of generating blob defects or organic residues. FIG. 1B shows that the region between remains unexposed during illumination exposure. Similarly, unexposed areas are shown between the relatively large fill structures of fill pattern 107.

FIG. 1C shows a wafer pattern after resist development. As can be seen, the main functional pattern 109 and the fill pattern 111 are printed on the wafer, while the SRAFs are not. In immersion lithography without a top coat, there is an increased risk of blob defects or organic residues in the non-exposed regions, due to the hydrophobicity of the unexposed photoresist. Such defects or residues can also be transported to other areas of the wafer during the development process, especially to neighboring areas as the main functional pattern 109, where they can lead to electrical failure and yield loss of the finished chips. Apart from the risk of characteristic defects, the reticle pattern density on the about 1μ scale drops from about 50% in the main functional pattern area 101 to about 0% in the area between the functional pattern and fill pattern 104, as shown in FIG. 1A, which can lead to reticle CD variations at the border of the functional pattern.

A need therefore exists for lithography methods, apparatus, and system enabling high resolution lithographic printing on a photoresist layer without a need for a top coat.

SUMMARY

An aspect of the present disclosure is a method for minimizing defectivity in top-coat-free lithography and improving reticle CD uniformity.

Another aspect of the present disclosure is a device for minimizing defectivity in top-coat-free lithography and improving reticle CD uniformity.

Another aspect of the present disclosure is a system for minimizing defectivity in top-coat-free lithography and improving reticle CD uniformity Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a photomask for a lithographic process including a lithographic exposure and a developing step, the forming including defining a first pattern in the photomask, the first pattern including a main functional pattern including structures; and defining a second pattern, the second pattern including a sub-resolution fill pattern in the photomask, in an area between structures of the first pattern or within one or more structures of the first pattern, or a combination thereof. The sub-resolution fill pattern includes sub-resolution structures that do not substantially modify a locally complete resist removal in the developing step, the sub-resolution fill pattern having a pitch or range of pitches smaller than a minimum resolved pitch of the lithographic exposure and/or at least a part of the sub-resolution structures not substantially modifying an imaging of any structure of the main functional pattern in the lithographic exposure. Another aspect includes providing a substrate coated with a photoresist without a top coat; exposing the substrate in the lithographic exposure; and developing the photoresist in the developing step.

Additional aspects include defining the sub-resolution fill pattern to include a regular pattern in an area of the sub-resolution fill pattern, the regular pattern including alternating lines and spaces, or contact-like structures, or a combination thereof. Another aspect includes defining the sub-resolution fill pattern to include a combination of dark and clear patterns. Another aspect includes defining a pitch or a range of pitches of the regular pattern of the sub-resolution fill pattern, the pitch or range of pitches being smaller than a minimum resolved pitch of the lithographic exposure. The pitch or range of pitches may be smaller than 80 nanometers (nm).

An additional aspect includes defining a direction of the regular pattern, the direction being a direction for which the minimum resolved pitch of the lithographic exposure has a maximum value. Another aspect includes adjusting a size of the sub-resolution structures of the sub-resolution fill pattern to correspond to a predetermined background intensity in the lithographic exposure, or to a predetermined pattern density of the sub-resolution fill pattern. Another aspect includes adjusting a size, a shape, or a position of sub-resolution structures of the sub-resolution fill pattern in a border region of the sub-resolution fill pattern to optimize, in the lithographic exposure, a depth of focus or contrast of a structure of the functional pattern in a vicinity of the sub-resolution structure of the sub-resolution fill pattern.

An additional aspect includes writing the sub-resolution fill pattern with a reduced number or complexity of optical proximity corrections, a reduced number of writing passes, a reduced writing dose, a faster writing time, or a less advanced photomask writing tool compared to a number or complexity of optical proximity corrections, a number of writing passes, a writing dose, a writing time, or a photomask writing tool, respectively, used for a writing of the functional pattern. Another aspect includes omitting an inspection or a part of an inspection for the sub-resolution fill pattern, or inspecting the sub-resolution fill pattern with a lower accuracy, a lower resolution, a faster inspection speed, a lower number of scans, or a less advanced inspection tool, compared to an accuracy, a resolution, an inspection speed, a number of scans, or an inspection tool, respectively, used for an inspection of the functional pattern. Another aspect includes detecting a defect in the sub-resolution fill pattern, and omitting a repair process for the defect in the sub-resolution fill pattern, or repairing the defect in the sub-resolution fill pattern with a lower accuracy, a faster repair speed, a lower number of iterations, or a less advanced repair tool, compared to an accuracy, a repair speed, a number of iterations, or a repair tool, respectively, used for a repair process for the functional pattern.

Another aspect of the present disclosure includes a device including: a photomask for a lithographic process including a lithographic exposure and a developing step, the photomask including a first pattern, the first pattern including a functional pattern having a main functional pattern including structures. Aspects include the photomask including a second pattern including a sub-resolution fill pattern defined in the photomask in an area between structures of the first pattern or within one or a plurality of the structures of the first pattern. Other aspects include the sub-resolution fill pattern including sub-resolution structures, the presence of which does not substantially modify a locally complete resist removal in the developing step, the sub-resolution fill pattern having a pitch or range of pitches smaller than a minimum resolved pitch of the lithographic exposure and/or at least a part of the sub-resolution structures not substantially modifying an imaging of any structure of the main functional pattern in the lithographic exposure.

An aspect includes the sub-resolution fill pattern including a regular pattern, the regular pattern including alternating lines and spaces or contact-like structures. Another aspect includes the sub-resolution fill pattern including a combination of dark and clear patterns. Another aspect includes the regular pattern of the sub-resolution fill pattern including a pitch or range of pitches smaller than a minimum resolved pitch of the lithographic exposure.

In another aspect, the direction of the regular pattern of the sub-resolution fill pattern is a direction for which the minimum resolved pitch of the lithographic exposure has a maximum value. In another aspect, a size of sub-resolution structures of the sub-resolution fill pattern corresponds to a predetermined background intensity in the lithographic exposure or a predetermined pattern density of the sub-resolution fill pattern. In an aspect, a size or shape or position of one or more sub-resolution structures of the sub-resolution fill pattern in a border region of the sub-resolution fill pattern is adjusted to optimize, in the lithographic exposure, a depth of focus or contrast of structures of the main functional pattern.

Another aspect of the present disclosure includes system including a processor or a plurality of processors, the processor or the plurality of processors configured to design a layout for a photomask for a chip layer and a lithography process for an exposure of a substrate with the photomask, the layout including a main functional pattern including structures, the processor or the plurality of processors configured to: define a fill area in the layout of the photomask and calculate a desired background illumination intensity for a substrate area corresponding to the fill area, the background illumination intensity being calculated to not cause a printing in the lithography process. Another aspect includes the processor or plurality of processors configured to select a fill pattern type for the one or more fill areas; define a pitch or range of pitches for the fill pattern types; define a fill pattern including sub-resolution structures, the fill pattern including the fill pattern type and the pitch or range of pitches in the fill area; calculate a size of the sub-resolution structures to correspond to desired background illumination intensity; adjust a size, a shape, or a position of sub-resolution structures in a border region of the fill areas to optimize a depth of focus or contrast in the exposure of the structures of the main functional pattern in a vicinity of the sub-resolution structures or optimize an illumination intensity for a substrate area corresponding to the sub-resolution structures, and calculate an optical proximity correction for structures of the main functional pattern of the layout for the photomask.

Additional features and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A through 2C schematically illustrate a photomask, an illumination intensity created on a photoresist film on a wafer by exposure through the photomask, and a print created by a development of the exposed photoresist film, respectively, in accordance with an exemplary embodiment;

FIGS. 5A through 5C schematically illustrate a photomask, an illumination intensity created on a photoresist film on a wafer by exposure through the photomask, and a print created by a development of the exposed photoresist film, respectively, in accordance with an exemplary embodiment;

FIGS. 7A through 7F schematically illustrate sub-pitch fill patterns for use in accordance with exemplary embodiments.

DETAILED DESCRIPTION

Figures 1A, 1B, 1C:
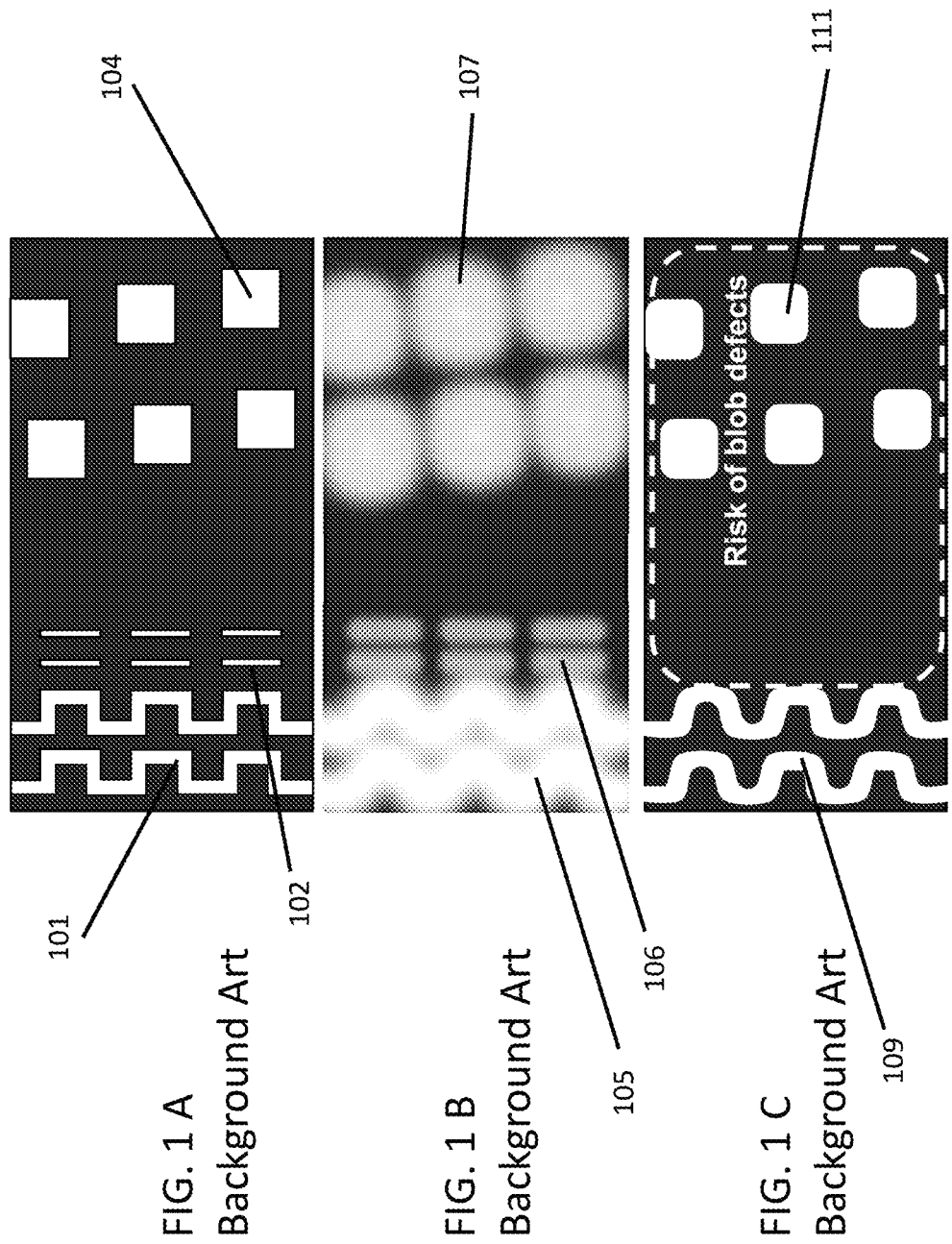
FIGS. 1A through 1C schematically illustrate photomasks and patterns.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about".

The present disclosure addresses and solves the current problems attendant upon top coat-free photolithographic processing, including potential coagulation of organic material in and near large unexposed areas of a photomask during development, pattern density variation that can lead to CD variations and non-uniformity on a reticle, and insufficient contrast in and near regions of high writing density. By forming and using sub-resolution and/or sub-pitch fill patterns and forming a homogenous pattern density in a photomask for the photolithographic printing process, large dark areas in a mask layout that can cause blob defects or organic residues on a wafer are avoided, large areas with high writing density that cause a decrease in contrast in the photomask patterning are avoided, and pattern density is homogenous on a submicron scale to avoid CD variation on the photomask caused by pattern density dependent effects. Accordingly, image defects, undesirable image quality, and materials degradation are avoided or minimized, and the need for a top-coat may be obviated.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 2A through 2C show a photomask, an illumination intensity on a substrate created by exposure through the photomask, and a printed substrate after a development process following the exposure, respectively, in accordance with an exemplary embodiment. In particular, FIG. 2A shows an area between the functional pattern 101, 102 and the fill pattern 104, and the area around the large fill structures within the fill pattern 104, filled with a sub-resolution fill pattern 201. The sub-resolution fill pattern 201 shown in FIG. 2A includes narrow open lines with a pitch that is smaller than a minimum resolved pitch of the lithographic exposure. Because the individual lines of the sub-resolution fill pattern 201 are not resolved in the wafer lithography process, the effect of the sub-resolution fill pattern 201 is to create a relatively weak homogeneous "background" illumination 203, as shown in FIG. 2B. The background illumination may be too weak to make the photoresist completely soluble in the development process, but intensive enough to generate some top loss during the development process, and to make the remaining resist surface in the area less hydrophobic. The effect is similar to the corresponding beneficial side effect of an immersion top coat. It is also similar to the effect of an attenuated phase shift or half-tone reticle, wherein the absorber layer has a transmission >0, typically 6%; such reticles have been found to have a more desirable defect performance than binary reticles in some layout circumstances. The term "background" should not be understood in the sense that the illumination from the sub-resolution fill pattern completely fills the area around the image of the functional pattern, which would degrade the contrast of the latter. Rather, as can be seen in FIG. 2B, the "background" illumination is designed to end at a relatively short distance from the image of the functional pattern 105, 106. On the other hand, the "background" illumination may merge into the image of the non-functional conventional fill pattern 107, for which pattern fidelity requirements may not be so stringent.

As shown in FIG. 2C, after development, the sub-resolution fill pattern 201 is not visible in the resulting resist pattern, which is essentially the same as in the conventional method illustrated in FIG. 1C, but the risk of blob defects is significantly reduced. Thus, top-coat free immersion lithography with a low defect level is enabled independently of the details of the wafer layout.

The fill pattern and areas outside the functional pattern area of the mask layout and print shown in FIG. 2A have a pattern density that is more homogeneous and more similar to an average pattern density of the functional pattern area than in the case of conventional mask layouts such as those shown in FIG. 1A. This reduces the risk of CD variations on the reticle. Because the sub-resolution fill pattern 201 generates a relatively homogeneous illumination and, as it is not printed on the wafer, does not interfere with the pattern of the previous or next layers, the sub-resolution fill pattern 201 may be placed in areas where the conventional, printing fill pattern cannot be placed, in particular it may be placed closer to the functional pattern than the conventional, printing fill pattern 104.

The additional fill pattern in the otherwise dark areas between and/or around the functional pattern and the conventional, printing fill pattern is designed in a way that it does not print on the wafer, i.e. it is a sub-resolution fill pattern. To this end, the image intensity of the fill pattern on the wafer must be substantially below the threshold value for resist development (or the illumination intensity at which the solubility of the photoresist in the developer process is substantially inverted) everywhere. Some such effect may also be achieved with a fill pattern having a pitch larger than the minimum resolved pitch that has structures that are too small to generate intensity above the threshold value, similar to the SRAFs 102. Thus, a fill pattern similar to SRAF structures 102 completely filling otherwise "empty" areas would achieve the effect of generating illumination in otherwise dark areas of the wafer, thereby reducing characteristic defects, and of creating a more homogeneous pattern density on the reticle, without generating printed pattern on the wafer. Such a fill pattern would differ from SRAF structures not so much by its appearance but by the fact that at least some of the structures of the fill pattern have no influence on the projected image of any structure of the main functional pattern. However, a sub-resolution fill pattern with a pitch smaller than the minimum resolved pitch, called a sub-pitch sub-resolution fill pattern in this disclosure, like pattern 201 has the additional benefits of generating a more homogeneous background illumination and of allowing a greater average illumination intensity on the wafer and a greater pattern density on the reticle without the risk of printing. In fact, for generating the same average background illumination on the wafer, a sub-pitch fill pattern may have larger structures than a corresponding pattern with a larger resolved pitch, since only the zeroth diffraction order from a sub-pitch pattern passes through the projection optics. Besides, sub-pitch fill pattern may be more easily identified as non-functional pattern, e.g. in an inspection of the reticle.

Although the risk of "blob" defects or organic residues in and near dark areas is particularly pronounced in top-coat free immersion lithography, due to the fact that immersion photoresists are designed to have a hydrophobic surface, layout dependent "blob" defects have also been observed in conventional, non-immersion lithography. Even with an immersion top coat or a conventional top anti-reflective coating (TARC), characteristic defects in or near dark areas may still occur, depending on the details of the layout and on the chemistry of the photoresist, immersion top coat or TARC, and development agents. Effects of pattern density variation on the reticle CD uniformity are independent of the nature of the photoresist system and the exposure process. The application of sub-resolution fill pattern is therefore not restricted to top-coat free immersion lithography.

In placing the sub-resolution fill pattern 201, it is beneficial to consider the, albeit relatively weak, influence the sub-resolution fill pattern has on the aerial image of the main functional pattern 101 and SRAFs 102. In particular, a distance between an onset of the sub-resolution fill pattern 201 and the main functional pattern 101 and/or SRAFs 102, or the position of the outermost structures of the sub-resolution fill pattern 201, should be optimized for the maximum depth of focus and contrast of the main functional pattern 101. Because enhancing the depth of focus and contrast of the main functional pattern is precisely the purpose of the SRAFs, if the main functional pattern is supported by SRAFs, the border region of the sub-resolution fill pattern should be optimized to not diminish, and if possible enhance, the effect of the SRAFs. For example, the distance of the first sub-resolution fill pattern structure to the outermost SRAF may be approximately equal to the distance between the SRAFs and the distance between the innermost SRAF and the main functional pattern. In doing so, the pitch of part of or the entire sub-resolution fill pattern 201 may be slightly adjusted to allow optimum joining of the sub-resolution fill pattern 201 to functional pattern and SRAFs on all sides. Apart from the position, the size and/or shape of the outermost structures of the sub-resolution fill pattern may also be adjusted for optimized depth of focus and/or contrast of the main functional pattern. Any effect of the sub-resolution fill pattern 201 on the printed size (CD) of the main functional pattern may be compensated for in the course of the optical proximity correction (OPC) process, which is part of the definition of the reticle pattern.

Although in FIG. 2A the sub-resolution or sub-pitch fill pattern 201 is the same in all regions of the layout clip shown, it is not necessary to make the fill pattern the same everywhere in the mask layout. For example, it may be beneficial for the reticle writing process (for example, for the required write time) or the interference of the sub-resolution fill pattern with adjoining functional pattern to vary the direction of the sub-resolution fill pattern (for example, between vertical and horizontal line/space pattern) between regions of the reticle layout. Also, other variants of the sub-resolution fill pattern 201 are possible, e.g. regularly spaced rectangles (contact-like pattern).

Figure 3:
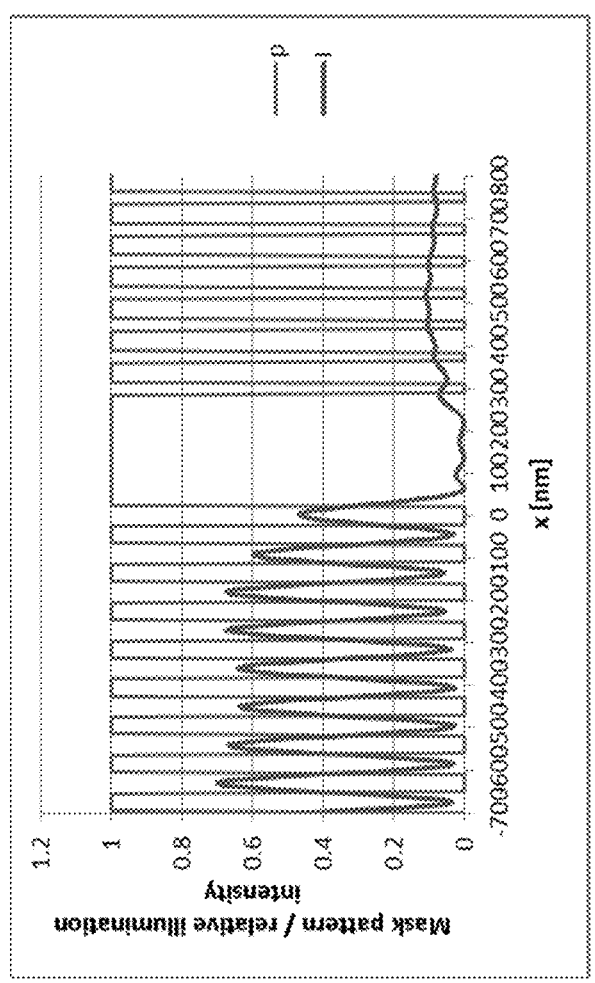
FIG. 3 is a graph showing simulation results for a mask pattern including a functional pattern and a sub-resolution, sub-pitch fill pattern versus relative illumination intensity on a substrate.
Figure 4:
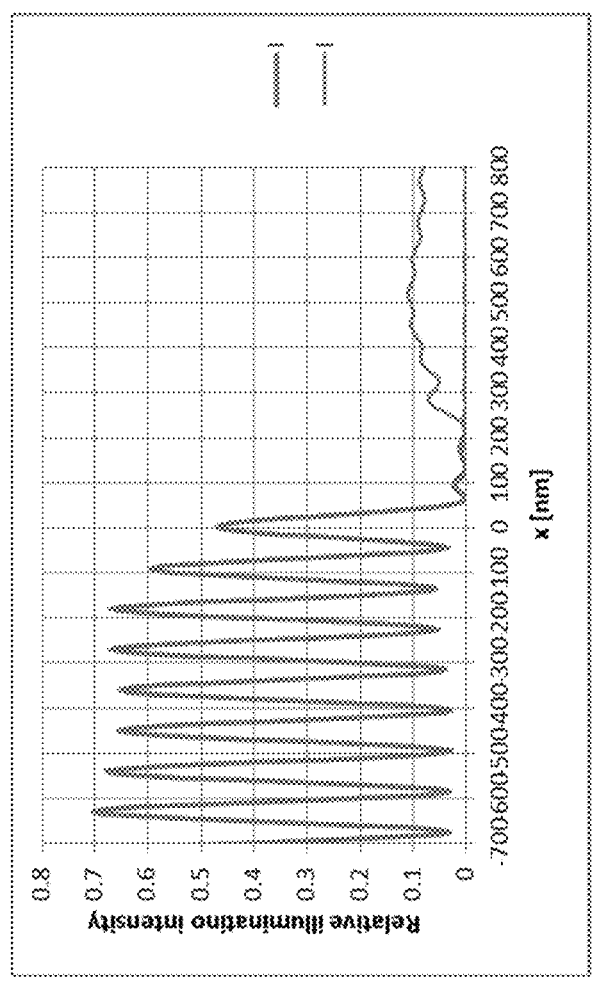
FIG. 4 is a graph showing a comparison of illumination intensities on a substrate during exposure using a photomask having a fill pattern and a photomask without a fill pattern, respectively.

An exemplary simulation of sub-pitch sub-resolution fill pattern, in this case again a line/space pattern, is shown in FIG. 3. In particular, FIG. 3 shows a simulation of a main functional pattern and sub-pitch fill pattern, comparing a mask pattern and a resulting illumination intensity on a wafer. FIG. 4 shows a comparison of illumination intensity without a fill pattern and illumination intensity with a fill pattern.

The main functional pattern (left side of each of FIGS. 3 and 4) has a 90 nm pitch and a duty cycle of 0.5. For simplicity, the simulations include no SRAFs or other OPC compensation at the edge of the main functional pattern. In practice, at least the outermost spaces of the main functional pattern may be upsized in the course of optical proximity correction to ensure a more uniform printed pattern size. The simulations are based on immersion lithography with a dipole exposure, 193 nm wavelength, a numerical aperture (NA) of 1.34 and a sigma value (illumination direction of the reticle relative to the numerical aperture) of 0.7. The sub-pitch fill pattern (right side of FIG. 3) has a pitch of 75 nm and a duty cycle of 0.3. The distance between functional and fill patterns is 300 nm. As can be seen, the fill pattern generates a homogeneous background illumination well below the development threshold (which is approximately half-way between the intensity maxima and minima of the functional pattern). The interference between the fill pattern and the functional pattern is very small. According to the simulation, only the image width (CD) of the outermost space is changed by about 1 nm (a difference so minor that it is hardly visible in the comparison of the intensity traces shown in FIG. 4), which can easily be compensated by OPC. It may be more beneficial, however, to bring the sub-resolution fill pattern closer to the main functional pattern (or SRAFs, if there are any), in a way to optimize the depth of focus and contrast of the main functional pattern. Thereby, not only the printing performance of the main functional pattern can be improved, but also the extent of the dark area between the functional and the fill pattern, which is detrimental for both preventing defects and reticle uniformity, is reduced.

Pitch and CD of the pattern on the reticle (main functional pattern, SRAFs, fill pattern, and sub-resolution fill pattern) are typically 4× the wafer values. For the example shown in FIG. 3, this corresponds to a 300 nm pitch and a 90 nm trench CD of the sub-resolution fill pattern. Such a pattern can easily be written and inspected with state of the art reticle tools. Moreover, a pitch below the resolution limit is easily identified by the reticle manufacturer (mask house) as not belonging to the functional pattern, so that the repair effort for such structures can be reduced or omitted. Of course, other sub-resolution fill structures, for example, even narrower open lines or contacts or dots instead of line/space structures can also be used.

In FIG. 2A the sub-resolution fill pattern 201 is depicted as a completely regular pattern up to its outer border. The same is true for the fill pattern depicted in FIG. 3. This regularity is not strictly necessary; substantially the same effect is achieved with a moderately irregular pattern, as long as substantially all distances between neighboring structures are substantially smaller than the minimum resolved pitch, and the sizes of neighboring structures within the pattern are substantially similar. This may be expressed by stating that a pattern has not a single pitch but a range of pitches that is substantially smaller than the minimum resolved pitch. In particular, it may be beneficial to modify the pitch and size of the outermost structures of the sub-resolution fill pattern, to enhance the depth of focus and contrast of the main functional pattern, and/or to ensure the desired light intensity at the border of the fill pattern area (for example, avoid diffractive ringing of the light intensity that might lead to printing of the fill pattern).

FIGS. 5A through 5C show the use of a dark sub-pitch fill pattern 504 in accordance with an embodiment to reduce the writing density and improve the homogeneity of reticle pattern density in a large open area. Thereby, the writing contrast and reticle CD uniformity are improved for the functional pattern next to the open area. FIG. 5A shows a mask layout having a main functional pattern 501, dark SRAFs 502, a conventional printing fill pattern 503, and a dark sub-pitch sub-resolution fill pattern 504. FIG. 5B shows the corresponding wafer illumination. Whereas the projected main functional pattern 105, SRAFs 106, and fill pattern 107 are shown as bright areas in FIG. 2B, in FIG. 5B functional pattern 505, 506 and fill pattern 507 are dark. FIG. 5C shows a resulting resist pattern with main functional pattern 511 and fill pattern 513 after development, wherein a reticle writing density in an open area next to the functional pattern 501, 502 is reduced (assuming that the reticle is patterned with a positive tone lithography process in which the written areas are opened up). Accordingly, the contrast of the reticle writing process is enhanced, and the writing density is advantageously homogenous, leading to enhanced reticle uniformity of the functional pattern 501, 502.

"Printing" a dark reticle pattern in the context of a positive lithographic process, as in FIGS. 5A to 5C, for example, is to be understood as meaning "preventing the corresponding resist area on the wafer from being removed in the development step", in contrast to the printing of a clear reticle pattern as shown in FIGS. 1A to 1C and 2A to 2C. Accordingly, in the context of a negative lithographic process, the term "printing" is again to be understood in the opposite sense. In a negative lithographic process, the printed pattern on the wafer resulting from the illumination shown in FIG. 5B would be similar to the wafer pattern shown in FIGS. 1C and 2C. In this case, the negative background illumination 508 created by sub-pitch, sub-resolution fill pattern 504 would make the resist surface slightly more soluble in the development step, likely leading to a certain top loss of the resist layer in this area during development, which again may be beneficial for defectivity in certain situations. Of course, the beneficial effect of the sub-resolution fill pattern on reticle writing density and/or pattern density uniformity is independent of the polarity of the lithographic process in which the reticle is used.

Figure 6A:
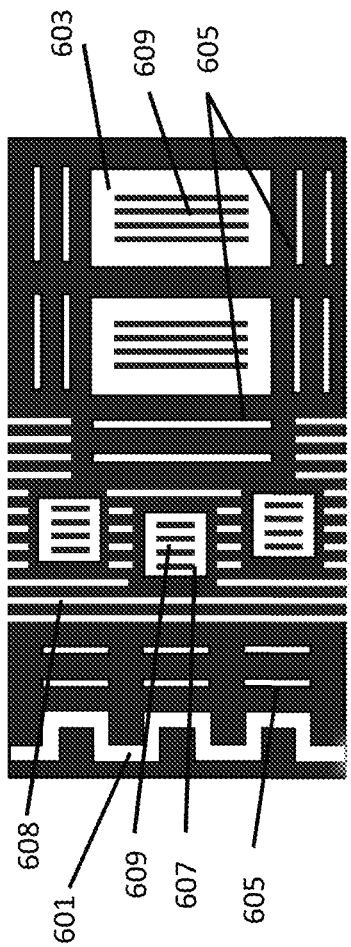
FIGS. 6A through 6C schematically illustrate a photomask, an illumination intensity created on a photoresist film on a wafer by exposure through the photomask, and a print created by a development of the exposed photoresist film, respectively, in accordance with an exemplary embodiment.
Figure 6B:
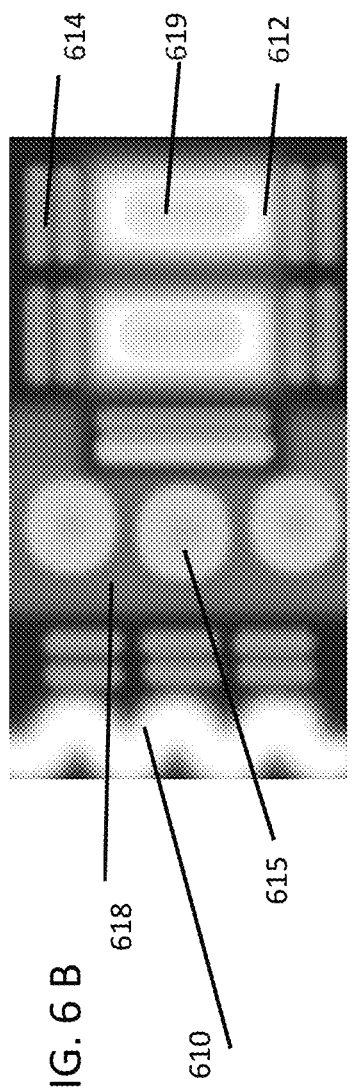
Figure 6C:
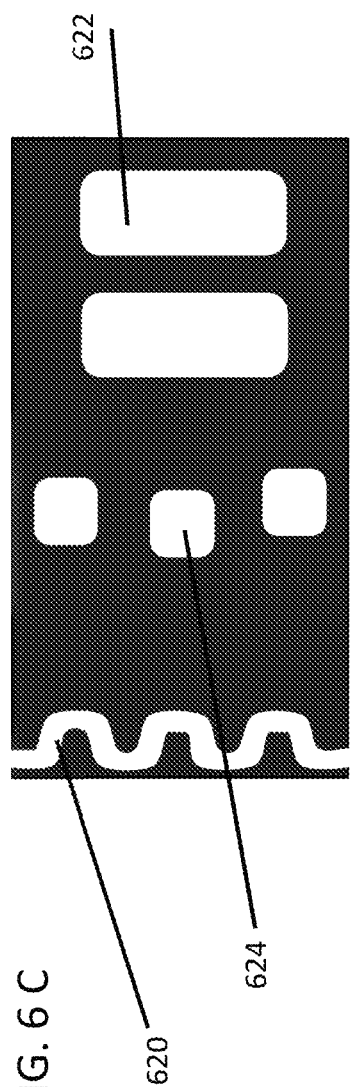

FIGS. 6A through 6C show the use of both dark and clear fill patterns, in accordance with an exemplary embodiment. FIG. 6A includes a main functional pattern including small structures 601 and large structures 603, which are supported by clear SRAFs 605, a conventional printing fill pattern 607, a clear sub-resolution sub-pitch fill pattern 608 in the area between and around the functional pattern and conventional fill pattern structures, respectively, and a dark sub-resolution sub-pitch fill pattern 609 within the conventional fill pattern structures and the large structures of the functional pattern. Here, the dark and clear sub-resolution fill patterns are used not only in "empty" dark areas, but, also inside a conventional fill pattern 607 and inside sufficiently large functional pattern structures 603. In placing sub-resolution fill patterns inside large functional pattern structures like structures 603, care must be taken to preserve sufficient optical contrast and depth of focus at the edge of the structure to define the printed structure on the wafer. Therefore, the fill pattern has to be at a certain minimum distance from the edge of the structures. In conventional fill pattern structures like structures 607, which do not need to have a high-quality image on the wafer, this precaution may not be necessary. Optimum pattern density homogeneity on the reticle may be achieved by placing sub-resolution fill pattern where possible.

FIG. 6B shows the corresponding wafer illumination. Main functional pattern 610, 612 and conventional fill pattern 615 are bright, unlike functional pattern 505, 506 and fill pattern 507 of FIG. 5B. SRAFs 614 are optically resolved, but with significantly lower intensity than the main functional pattern and the conventional fill pattern. The clear sub-pitch sub-resolution fill pattern between and around the larger structures creates a homogeneous background illumination 618 in the otherwise dark areas. Dark sub-pitch sub-resolution fill pattern decreases the illumination intensity of the conventional fill pattern 615 and in the inner portion 619 of the large functional structures 612. FIG. 6C shows a resulting resist pattern with main functional pattern 620, 622 and fill pattern 624 after development, wherein a reticle writing density in a dark area between and around the functional pattern and the conventional, printing fill pattern is increased, and a reticle writing density inside large clear structures is reduced. Accordingly, the contrast of the reticle writing process is partially enhanced, and the writing density is advantageously homogenous, leading to enhanced reticle uniformity of the main functional pattern 620, 622.

To avoid a significant negative impact of the sub-resolution fill pattern on reticle manufacturing (e.g. e-beam writing) time, this pattern can be written with a simplified, and therefore faster, writing process than the functional pattern. For example, OPC modifications like jogs, which lead to the fracturing of the reticle pattern into smaller e-beam shot sizes, can be reduced or omitted. Besides, in the writing process, multi-pass writing can be replaced by one-pass writing, the total writing dose can be reduced, or the writing speed can be increased. Finally, in some special cases the fill pattern could be written in a separate patterning step on a less advanced reticle lithographic tool, for example, a laser instead of an e-beam writer. Also in some subsequent reticle processing steps, namely inspection and repair, the processing step can be simplified or completely omitted for the sub-resolution fill pattern to save reticle manufacturing time and cost.

In the design of the sub-pitch fill pattern, the orientation of the lithographic illumination can be considered to deliberately degrade the optical resolution of the fill pattern and thereby allow the use of larger pitches and/or shapes which may be easier, for example, faster, to pattern on the reticle. This is shown in FIGS. 7A through 7F. The most obvious case is dipole illumination as illustrated in FIG. 7A. Here, if the fill pattern is oriented "wrong-way" as in FIG. 7C (as opposed to FIG. 7B), the pitch of the fill pattern can be equal to or even larger than the the design pitch without leading to the resolution of the individual lines and spaces. Similarly, for a quadrupole illumination as shown in FIG. 7D, a contact-like fill pitch can be rotated by 45°, e.g. as illustrated in FIG. 7F (as opposed to FIG. 7E) to push it below the resolution threshold.

The sub-resolution fill pattern in accordance with exemplary embodiments is most applicable to binary reticles in which dark areas are very dark (essentially zero transmission), such as with chrome on glass (COG) or opaque molybdenum silicide (MoSi) on glass (OMOG) reticles. With half tone or attenuated phase shift reticles, the "dark" areas have a certain transmission, typically about 6% (together with about a 180° phase shift of the transmitted light), that already leads to a certain illumination of "dark" areas on the wafer and thereby reduces the sensitivity to "blob" defects. The problem, however, of reticle pattern density uniformity applies to half tone reticles as well. Another consideration is that sub-resolution fill pattern can lead to a higher illumination intensity of "dark" areas than e.g. 6% with half tone reticles. Therefore, sub-resolution fill pattern is beneficial for half tone reticles as well. Generally, the relative zero-order transmission intensity of a regular line/space pattern is approximately given by the formula:

$$I = c^2 + (1-c)^2 T + 2c(1-c)\sqrt{T}\cos\phi$$

$$\Rightarrow c = \frac{1}{1+T-2\sqrt{T}\cos\phi} \cdot$$

$$\left(\sqrt{T(\cos^2\phi - 1) + (1+T-2\sqrt{T}\cos\phi) \cdot I} + T - \sqrt{T}\cos\phi\right)$$

wherein c is the clear field percentage (duty cycle) of the pattern, T is the transmission of the "dark" areas, and $\phi$ is the phase shift. For a phase shift of $\phi=180°$ and a transmission of T=6%, the formula becomes:

$$c = 0.645 \cdot (1.245 \cdot \sqrt{I} + 0.305).$$

Thus, for example, to create a relative uniform illumination of 10%, a typical half tone reticle requires a clear field percentage (duty cycle) of the sub-pitch fill pattern of 45%, compared to 32% for a binary reticle. The creation of a sub-pitch fill pattern with a 45% duty cycle is no problem with state of the art mask patterning technology. Thus, although the application of a sub-resolution fill pattern is expected to be most beneficial in terms of on-wafer defectivity for binary reticles, it is not restricted to this reticle type.

Figure 8:
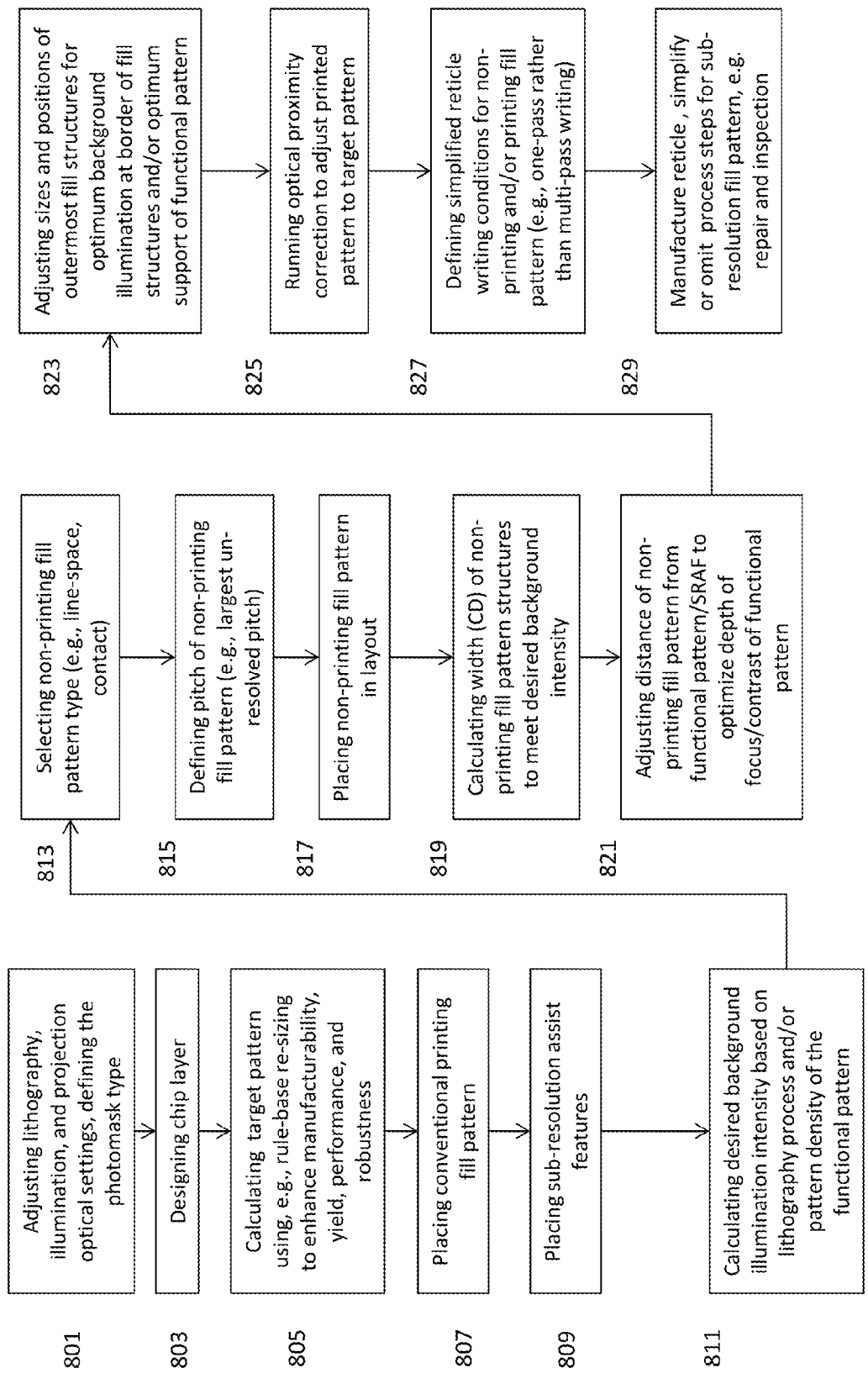
FIG. 8 shows a process flow for forming a photomask in accordance with an exemplary embodiment.

FIG. 8 shows an exemplary process flow for generating the sub-resolution fill pattern in accordance with an exemplary embodiment. The process may be simplified, for example, by omitting some of the adjustment steps (821, 823) or the placement of conventional, printing fill pattern (807) and/or sub-resolution assist features (SRAFs, step 809), or modified, for example by changing the order of some steps, for example by calculating the desired background intensity (811) after the definition of the sub-resolution fill pattern type and pitch (813, 815), by doing a first iteration of the OPC algorithm before placement of the sub-resolution fill pattern, or by reiterating the adjustment of the sub-resolution fill pattern at the border region to the functional pattern in the course of the OPC process.

Adverting to FIG. 8, the process flow begins with defining the lithographic process including illumination and projection optical settings, and defining the photomask type at 801. A chip layer may be designed at 803. Steps 805 through 825 then describe the definition or creation of the mask layout (the ensemble of all patterns or structures to be formed on the reticle). A target pattern is calculated from the chip layer design at 805, using, for example, a rule-based re-sizing of certain structures in the design to enhance manufacturability, yield, performance, and robustness.

Next, at 807 a conventional fill pattern is placed in the layout, and sub-resolution assist features may be placed at 809. A desired background illumination intensity based on lithography processes, reticle manufacturing processes, and local pattern density may be calculated at 811. At 813, a non-printing sub-resolution fill pattern type may be selected. A pitch of the non-printing fill pattern may be defined at 815. For example, substantially a largest unresolved pitch may be defined. As mentioned above, the sub-resolution fill pattern type and/or pitch need not be the same everywhere in the layout; the same is true for the desired background illumination intensity. The non-printing fill pattern may then be placed in the layout at 817.

A width (CD) of non-printing fill pattern structures may be calculated to meet a desired background intensity at 819. A distance of non-printing fill pattern from a functional pattern and/or SRAFs may be adjusted at 821. In particular, the distance may be adjusted to optimize a depth of focus and contrast of a main functional pattern. The adjustment of distances to functional pattern on several sides of areas of non-printing fill pattern may also necessitate an adjustment of the fill pattern pitch.

Sizes and positions of outermost fill structures may be optimized at 823. In particular, the sizes and positions of outermost fill structures of a non-printing or sub-resolution fill pattern may be adjusted to optimize for background illumination at a border of fill structures and for optimum support of a main functional pattern.

Optical proximity correction may be performed at 825. In particular, optical proximity correction may be run to adjust a printed pattern with respect to a target pattern. Simplified reticle writing conditions may be defined for fill pattern at 827. For example, a simplified reticle writing condition for a non-printing and/or printing fill pattern may be defined by using one-pass writing, rather than multi-pass writing. At 829, a reticle may be manufactured accordingly. Process steps such as inspection for quality or repair may be simplified or omitted for the sub-resolution and/or printing fill pattern.

The embodiments of the present disclosure can achieve several technical effects. By forming and using sub-resolution fill pattern, and particularly sub-pitch sub-resolution fill pattern in a photomask for the photolithographic printing process, image defects, undesirable image quality, and materials degradation are avoided or minimized, and top-coat-free lithographic processing is enhanced. Embodiments of the present disclosure enjoy utility in various industrial applications, e.g., microprocessors, smart-phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method, comprising:
   forming a photomask for a lithographic process comprising a lithographic exposure and a developing step, the forming comprising:
   defining a first pattern in the photomask, the first pattern comprising a main functional pattern, the main functional pattern comprising structures; and
   defining a second pattern in the photomask, the second pattern comprising a sub-resolution fill pattern in one or more areas between structures of the first pattern or within one or more structures of the first pattern, the sub-resolution fill pattern comprising sub-resolution structures that do not substantially modify a locally complete resist removal in the developing step, the sub-resolution fill pattern having a pitch or range of pitches smaller than a minimum resolved pitch of the lithographic exposure and/or at least a part of the sub-resolution structures of the sub-resolution fill pattern not substantially modifying an imaging of any structure of the main functional pattern in the lithographic exposure.

2. The method according to claim 1, comprising:
defining the sub-resolution fill pattern to comprise a regular pattern in an area of the sub-resolution fill pattern, the regular pattern comprising alternating lines and spaces, or contact-like structures, or a combination thereof.

3. The method according to claim 2, comprising:
defining the sub-resolution fill pattern to comprise a combination of dark and clear patterns.

4. The method according to claim 2, comprising:
defining a pitch or a range of pitches of the regular pattern of the sub-resolution fill pattern, the pitch or range of pitches being smaller than a minimum resolved pitch of the lithographic exposure.

5. The method according to claim 4, comprising:
defining the pitch or range of pitches to be smaller than 80 nanometers (nm).

6. The method according to claim 4, comprising:
defining a direction of the regular pattern, the direction being a direction for which the minimum resolved pitch of the lithographic exposure has a maximum value.

7. The method according to claim 1, comprising:
adjusting a size of the sub-resolution structures of the sub-resolution fill pattern to correspond to a predetermined background intensity in the lithographic exposure, and/or to a predetermined pattern density of the sub-resolution fill pattern.

8. The method according to claim 1, comprising:
adjusting a size, a shape, and/or a position of one or more sub-resolution structures of the sub-resolution fill pattern in a border region of the sub-resolution fill pattern to optimize, in the lithographic exposure, a depth of focus and/or contrast of one or more structures of the main functional pattern in a vicinity of the one or more sub-resolution structures of the sub-resolution fill pattern.

9. The method according to claim 1, the forming of the photomask further comprising:
writing the sub-resolution fill pattern with a reduced number and/or complexity of optical proximity corrections, a reduced number of writing passes, a reduced writing dose, a faster writing time, and/or a less advanced photomask writing tool compared to a number and/or complexity of optical proximity corrections, a number of writing passes, a writing dose, a writing time, and/or a photomask writing tool, respectively, used for a writing of the main functional pattern.

10. The method according to claim 1, the forming of the photomask further comprising:
omitting an inspection or a part of an inspection for the sub-resolution fill pattern, or inspecting the sub-resolution fill pattern with a lower accuracy, a lower resolution, a faster inspection speed, a lower number of scans, and/or a less advanced inspection tool, compared to an accuracy, a resolution, an inspection speed, a number of scans, and/or an inspection tool, respectively, used for an inspection of the main functional pattern.

11. The method according to claim 1, the forming of the photomask further comprising:
detecting a defect in the sub-resolution fill pattern, and omitting a repair process for the defect in the sub-resolution fill pattern, or repairing the defect in the sub-resolution fill pattern with a lower accuracy, a faster repair speed, a lower number of iterations, and/or a less advanced repair tool, compared to an accuracy, a repair speed, a number of iterations, and/or a repair tool, respectively, used for a repair process for the main functional pattern.

12. The method according to claim 1, comprising:
providing a substrate coated with a photoresist without a top coat;
exposing the substrate in the lithographic exposure; and developing the photoresist in the developing step.

13. A device, comprising:
a photomask for a lithographic process comprising a lithographic exposure and a developing step, the photomask comprising:
a first pattern, the first pattern comprising a functional pattern, the functional pattern comprising a main functional pattern, the main functional pattern comprising structures; and
a second pattern, the second pattern comprising a sub-resolution fill pattern defined in the photomask in one or more areas between structures of the first pattern or within one or a plurality of the structures of the first pattern, the sub-resolution fill pattern comprising sub-resolution structures, the presence of which does not substantially modify a locally complete resist removal in the developing step, the sub-resolution fill pattern having a pitch or range of pitches smaller than a minimum resolved pitch of the lithographic exposure and/or at least a part of the sub-resolution structures of the sub-resolution fill pattern not influencing an imaging of any structure of the main functional pattern in the lithographic exposure.

14. The device according to claim 13, wherein the sub-resolution fill pattern comprises a regular pattern, the regular pattern comprising alternating lines and spaces or contact-like structures or a combination thereof.

15. The device according to claim 13, wherein the sub-resolution fill pattern comprises a combination of dark and clear patterns.

16. The device according to claim 14, wherein the regular pattern of the sub-resolution fill pattern comprises a pitch or range of pitches smaller than a minimum resolved pitch of the lithographic exposure.

17. The device according to claim 14, wherein a direction of the regular pattern of the sub-resolution fill pattern is a direction for which the minimum resolved pitch of the lithographic exposure has a maximum value.

18. The device according to claim 13, wherein a size of sub-resolution structures of the sub-resolution fill pattern corresponds to a predetermined background intensity in the lithographic exposure and/or a predetermined pattern density of the sub-resolution fill pattern.

19. The device according to claim 13, wherein a size and/or shape and/or position of one or more sub-resolution structures of the sub-resolution fill pattern in a border region of the sub-resolution fill pattern is adjusted to optimize, in the lithographic exposure, a depth of focus or contrast of one or more structures of the main functional pattern.

20. A system comprising:
a processor or a plurality of processors, the processor or the plurality of processors configured to design a layout for a photomask for a chip layer and a lithography process for an exposure of a substrate with the photomask, the layout comprising a main functional pattern comprising structures, the processor or the plurality of processors configured to:

define a fill area in the layout of the photomask and calculate a desired background illumination intensity for a substrate area corresponding to the fill area, the background illumination intensity being calculated to not cause a printing in the lithography process;
select a fill pattern type for the one or more fill areas;
define a pitch or range of pitches for the fill pattern types;
define a fill pattern comprising sub-resolution structures, the fill pattern comprising the fill pattern type and the pitch or range of pitches in the fill area;
calculate a size of the sub-resolution structures to correspond to desired background illumination intensity;
adjust a size, a shape, or a position of one of more sub-resolution structures in a border region of the fill areas to
optimize a depth of focus and/or contrast in the exposure of the structure of the main functional pattern in a vicinity of the sub-resolution structures or optimize an illumination intensity for a substrate area corresponding to the sub-resolution structures, and
calculate an optical proximity correction for structures of the main functional pattern of the layout for the photomask.

* * * * *